United States Patent
Ramesh et al.

(10) Patent No.: US 9,768,987 B2
(45) Date of Patent: Sep. 19, 2017

(54) DYNAMICALLY CALIBRATED PRE-DISTORTION

(71) Applicant: MaxLinear, Inc., Carlsbad, CA (US)

(72) Inventors: Sridhar Ramesh, Carlsbad, CA (US); Timothy Gallagher, Encinitas, CA (US); Ali Shahed hagh ghadam, Encinitas, CA (US)

(73) Assignee: MAXLINEAR, INC., Carlsbad, CA (US)

(*) Notice: Subject to any disclaimer, the term of this patent is extended or adjusted under 35 U.S.C. 154(b) by 0 days.

(21) Appl. No.: 14/595,896

(22) Filed: Jan. 13, 2015

(65) Prior Publication Data

US 2015/0200795 A1    Jul. 16, 2015

Related U.S. Application Data

(60) Provisional application No. 61/926,428, filed on Jan. 13, 2014.

(51) Int. Cl.
| | |
|---|---|
| *H04L 25/03* | (2006.01) |
| *H03F 1/32* | (2006.01) |
| *H04L 27/36* | (2006.01) |
| *H04B 15/00* | (2006.01) |

(52) U.S. Cl.
CPC ...... *H04L 25/03343* (2013.01); *H03F 1/3211* (2013.01); *H04L 27/367* (2013.01); *H03F 1/3241* (2013.01); *H04B 15/00* (2013.01)

(58) Field of Classification Search
None
See application file for complete search history.

(56) References Cited

U.S. PATENT DOCUMENTS

| | | | |
|---|---|---|---|
| 2007/0153884 A1* | 7/2007 | Balasubramanian . | H03F 1/3247 375/221 |
| 2007/0223621 A1* | 9/2007 | Ahmed ................. | H03F 1/3247 375/296 |
| 2008/0095264 A1* | 4/2008 | Deng .................... | H03F 1/3247 375/296 |
| 2008/0225984 A1* | 9/2008 | Ahmed ................... | H03C 5/00 375/302 |
| 2010/0048149 A1* | 2/2010 | Tang ..................... | H03F 1/3247 455/114.3 |

* cited by examiner

*Primary Examiner* — Leon-Viet Nguyen
(74) *Attorney, Agent, or Firm* — McAndrews, Held & Malloy, Ltd.

(57) ABSTRACT

Systems and methods are provided for dynamic calibration of pre-distortion modification in transmitters. The pre-distortion modification may be applied during processing of an input signal for transmission, and feedback data, relating to the transmitter and/or processing performed after application of the pre-distortion modification in the transmitter, may be obtained. Adjustments to the pre-distortion modification may be determined based on the feedback data, and the adjustments to the pre-distortion modification may be applied in loop-back manner, thus enabling adjustment of pre-distortion modification dynamically based on real-time and current data. The pre-distortion modification may comprise modifying one or more signal characteristics, such as phase, frequency, and/or amplitude. Determining and/or applying the adjustments to the pre-distortion modification may be done periodically, based on one or more particular events, or conditionally.

16 Claims, 5 Drawing Sheets

US 9,768,987 B2

DYNAMICALLY CALIBRATED PRE-DISTORTION

CLAIM OF PRIORITY

This patent application makes reference to, claims priority to and claims benefit from the U.S. Provisional Patent Application Ser. No. 61/926,428, filed Jan. 13, 2014. The above identified application is hereby incorporated herein by reference in its entirety.

TECHNICAL FIELD

Aspects of the present disclosure relate to communication systems and technologies. More specifically, certain implementations of the present disclosure relate to methods and systems for dynamically calibrated pre-distortion.

BACKGROUND

Conventional systems and methods for pre-distortion can be inefficient and ineffective. Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for dynamically calibrated pre-distortion, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION OF THE INVENTION

As utilized herein the terms "circuits" and "circuitry" refer to physical electronic components (e.g., hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z." As utilized herein, the term "exemplary" means serving as a non-limiting example, instance, or illustration. As utilized herein, the terms "for example" and "e.g." set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

Figure 1:
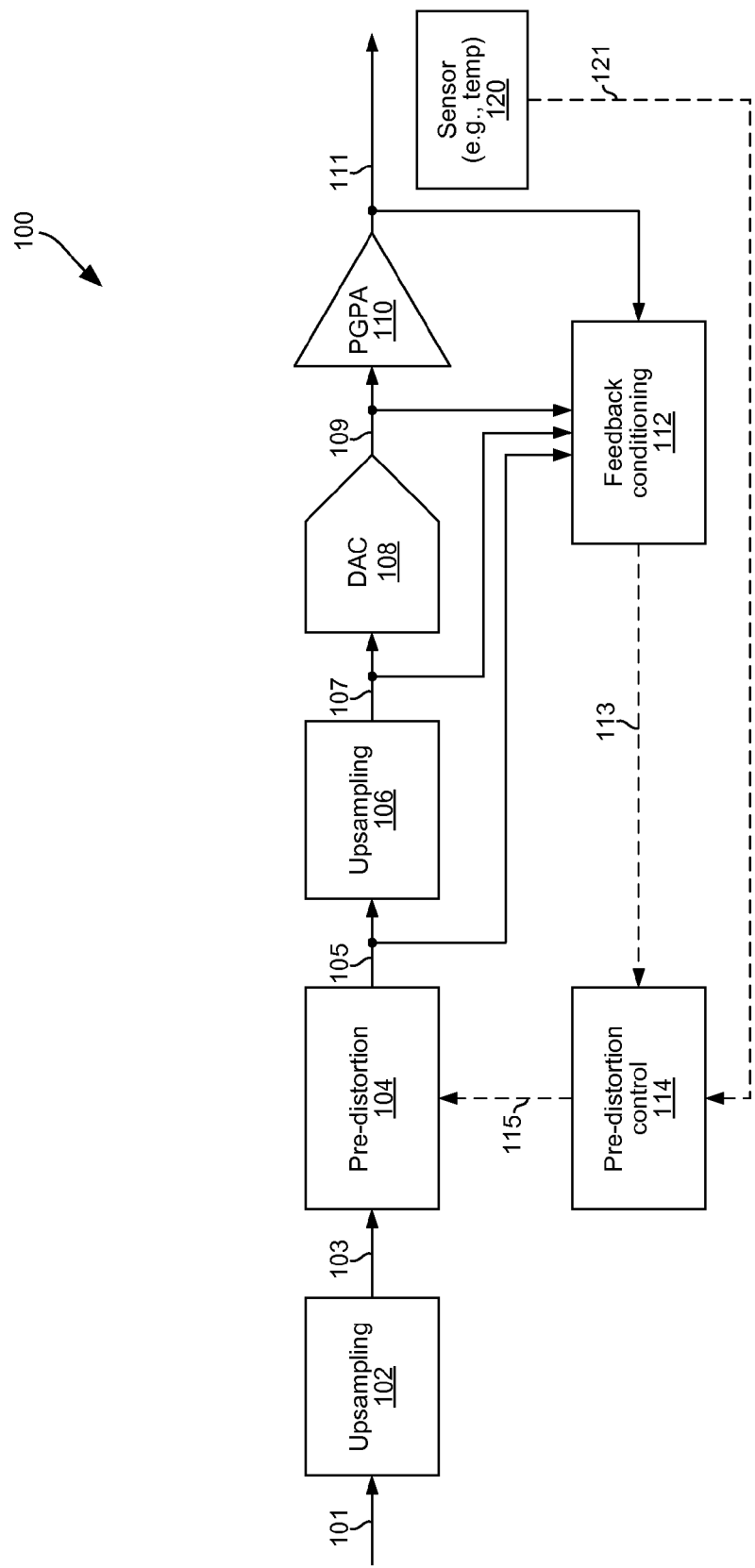
FIG. 1 depicts an example transmitter that may be operable to perform dynamic calibration of pre-distortion, in accordance with the present disclosure.

FIG. 1 depicts an example transmitter that may be operable to perform dynamic calibration of pre-distortion, in accordance with the present disclosure. Shown in FIG. 1 is an example transmitter 100.

The transmitter 100 may comprise suitable circuitry for processing and transmitting signals, which may be configured for communication in accordance with one or more wireless or wire-based interfaces (and/or protocols). The transmitter 100 may be configured to perform dynamic calibration of pre-distortion during transmission related operations. For example, as shown in the example implementation depicted in FIG. 1, the transmitter 100 may comprise an upsampling circuit 102, a pre-distortion circuit 104, an upsampling circuit 106, a digital-to-analog convertor (DAC) circuit 108, a programmable gain power amplifier (PGPA) circuit 110, a feedback conditioning circuit 112, and a pre-distortion control circuit 114. Also shown is a sensor 120, which may be a temperature ("temp") sensor. The sensor 120 may be part (e.g., a component) of the transmitter 100. Alternatively, in some example implementations, the sensor 120 may be separate from (but communicatively coupled to) the transmitter 100.

Each of the upsampling circuits 102 and 106 may be operable to generate an output signal by upsampling an input signal.

The pre-distortion circuit 104 may be operable to modify (e.g., distort) characteristics (e.g., phase, frequency, and/or amplitude) of an input signal, such as based on a control signal (and/or pre-programmed settings).

The DAC circuit 108 is operable to convert a digital input signal into a corresponding analog representation (output). The DAC circuit 108 may be configured to operate with any suitable digital-to-analog conversion technique or scheme.

The PGPA circuit 110 may be operable to generate an output signal by amplifying an input signal. The PGPA circuit 110 may be configured to amplify the input signal based on particular criteria—e.g., so that the output signal would have sufficient power for propagation over a physical medium to a receiver. Further, the PGPA circuit 110 may be configured to introduce certain modification—e.g., phase, frequency, and/or amplitude distortion. In some implementations, the PGPA circuit 110 may be implemented and/or configured to have frequency dependent and frequency independent amplitude and/or phase response.

The pre-distortion control circuit 114 may be operable to control the pre-distortion circuit 104, such as by generating a control signal (e.g., signal 115 in FIG. 1) that may control or adjust the pre-distortion circuit 104, or operations thereof. For example, pre-distortion control circuit 114 may be operable to adjust, via the control signal 115, tap coefficients of one or more filters of the pre-distortion circuit 104. The pre-distortion control circuit 114 may receive as an input a control signal (control signal 113 in FIG. 1), and may generate its own control signal 115 based on that input control signal. Example implementations of the feedback conditioning circuit 112 are described below with reference to FIGS. 2A and 2B.

The feedback conditioning circuit 112 may be operable to control the pre-distortion control circuit 114, such as by generating the control signal 113. In particular, the feedback conditioning circuit 112 is configured to operate in feedback manner, such as by conditioning one or more signals obtained further down (relative to the pre-distortion circuit 104) the transmit path for use in the pre-distortion circuit 114. For example, as shown in FIG. 1, feedback conditioning circuit 112 may condition one or more of: output signal of the pre-distortion circuit 104 (e.g., signal 105 in FIG. 1), output signal of the upsampling circuit 106 (e.g., signal 107 in FIG. 1), output signal of the DAC circuit 108 (e.g., signal 109 in FIG. 1), and output signal of the PGPA circuit 110 (e.g., signal 111 in FIG. 1), to make the signal(s) suitable for use by the pre-distortion circuit 114. The outcome of such conditioning is reflected in the control signal 113.

The sensor 120 comprise suitable circuitry (and/or other hardware) for obtaining particular sensory information (e.g., temperature), and for generating a corresponding control signal (e.g., signal 121 in FIG. 1) indicating or reporting that sensory information. For example, the sensor 120 may be operable to sense and indicate (via the control signal 121) a temperature of the transmitter 100 generally and/or of one or more of the components 102, 104, 106, 108, 110 specifically.

In an example operation, starting with an input signal 101 (e.g., a baseband data-carrying signal), the upsampling circuits 102 may upsample the signal 101 to generate a corresponding signal (e.g., signal 103 in FIG. 1). The signal 103 may then be input into the pre-distortion circuit 104, which may modify (i.e., distort) characteristics (e.g., phase, frequency, and/or amplitude) of the signal 103, such as based on the control signal 115, to generate a pre-distorted signal (e.g., signal 105 in FIG. 1). The pre-distorted signal 105 may be input into the upsampling circuit 106, which may upsample the pre-distorted signal 105 to generate a corresponding upsampled pre-distorted signal (e.g., signal 107 in FIG. 1). The upsampled pre-distorted signal 107, which may be a digital signal, may be fed into the DAC circuit 108, for digital-to-analog conversion thereby, resulting in corresponding analog signal 109. The PGPA circuit 110 may then amplify the analog signal 109, to generate the corresponding signal 111, which may have sufficient power for propagation over a physical medium to a receiver. The signal 111 (or modified copy thereof) may then be transmitted, via a suitable front-end (not shown). The PGPA circuit 110 may introduce phase, frequency, and/or amplitude distortion.

In various implementations, the transmitter 100 may be operable to perform dynamic calibration of pre-distortion, such as based on feedback. In this regard, a goal of the modifications performed by pre-distortion circuit 104 (e.g., on the signal 103) may be to cancel and/or compensate for distortion introduced by the other elements further down the transmit path—e.g., the upsampling circuit 106, the DAC circuit 108, and/or the PGPA circuit 110. Such distortion may dynamically change. For example, distortion introduced by the PGPA circuit 110 may change as certain conditions (e.g., temperature; power supply voltage; amplitude, phase; amplitude, phase, and/or frequency of signal 109; etc.) may change. Accordingly, in various implementations, pre-distortion may be dynamically calibrated, such as by dynamically adjusting parameters of the pre-distortion circuit 104 to account for such changed conditions/parameters in, or near, real-time.

For example, in the particular example implementation shown in FIG. 1, the pre-distortion control circuit 114 may be used to control or adjust the pre-distortion being performed via the pre-distortion circuit 104. The pre-distortion control circuit 114 may generate the control signal 115, which may be input to the pre-distortion circuit 104 to enable controlling and/or adjusting operations thereof. For example, the pre-distortion circuit 104 may comprise one or more filters that are used in applying the modifications made to the signal 103, and the control signal 115 may be used in, e.g., adjusting tap coefficients of one or more filters of the pre-distortion circuit 104.

The pre-distortion control circuit 114 may be controlled based on input (e.g., the control signal 113) from the feedback conditioning circuit 112 (thus facilitating the adaptive, feedback based, control of pre-distortion). For example, the feedback conditioning circuit 112 may condition one or more of the signal(s) 111, 109, 107, and 105; to make the signal(s) suitable for use by the pre-distortion circuit 114. The result of the conditioning performed by the feedback conditioning circuit 112 may be conveyed via the control signal 113, and ultimately the effect of the conditioned signals may be conveyed to (e.g., used to control) pre-distortion circuit 104 via the control signal 115.

The pre-distortion control circuit 114 may also be controlled based on sensory-based input, such as from the sensor 120. For example, the sensor 120 may obtain temperature related information relating to the transmitter 100 (and/or it various components thereof), and may output based thereon the signal 121, which may indicate temperature of the transmitter 100 generally, and/or of one or more of the components 102, 104, 106, 108, 110 specifically. Other factors that may be considered in controlling the pre-distortion performed in the transmitter 100 (e.g., being feed into and used by the pre-distortion control circuit 114) may comprise parameters relating or pertinent to function of other components (e.g., PGPA circuit gain).

In an example implementation, adjusting operation of the pre-distortion circuit 114 (e.g., by changing and/or updating pertinent operational parameters of the pre-distortion circuit 114, such as filter taps) may be periodic, event-based, and/or conditional. For example, the pre-distortion circuit 114 (or operation thereof) may be updated or adjusted periodically, such as every N (a positive real number) seconds, and/or in response to a particular event, such as transmission of every $M^{th}$ packet (a positive real number). Conditions which may determine whether and/or when the pre-distortion circuit 114 (or operation thereof) is updated or adjusted may comprise, for example, absolute characteristics (e.g., phase, frequency, power, etc.) of one or more reference signals (e.g., signal 109 and/or signal 111), relative characteristics (e.g., phase, frequency, power, etc.) of one or more reference signals (e.g., signal 109 and/or signal 111), parameters relating or pertinent to function of other components (e.g., PGPA circuit gain), absolute environmental condition (e.g., only update when temperature is outside a predetermined window), and relative environmental condition (e.g., only update when temperature has changed by more than X (a real number) degrees relative to the temperature at the time of the last update).

In this regard, an absolute characteristic condition may be determined based on state (e.g., value) of a particular characteristic (e.g., phase, frequency, power) of a reference signal in comparison to one or more applicable thresholds or criterion, regardless of a previous state of that characteristic. For example, an update or adjustment may be conditionally performed only when power of the signal 109 is above (or below) a particular threshold, when frequency of the signal 111 is above (or below) a particular threshold, etc. A relative characteristic condition may be determined based on measure (e.g., amount) of change in a particular characteristic (e.g., phase, frequency, power) of a reference signal in relation to a previous state of that characteristic, particularly the measure of change in comparison to one or more applicable thresholds or criterion. For example, an update or adjustment may be conditionally performed only when phase of the signal 109 has changed (increased or decreased) by more than a predetermine amount relative to the phase at the time of the last update, when power of the signal 111 has changed (increased or decreased) by more than a determined amount relative to the power at the time of the last update.

The conditions (particular reference signal and/or particular characteristic thereof, particular parameter relating particular component, particular environment condition, etc.), type of condition (e.g., absolute vs. relative), and/or applicable parameters (e.g., thresholds, windows, etc.) or criteria used in determining and/or assessing when conditions (relative or absolute) are met may be per-determined or pre-programmed. Further, the conditions, condition types, and/or applicable parameters (e.g., thresholds, windows, etc.) or criteria may be modifiable—e.g., based on user input.

In an example implementation, to further enhance performance (e.g., power consumption), the pre-distortion control circuit 114 and/or the feedback conditioning circuit 112 may be fully or partially powered down between updates of parameters of the pre-distortion circuit 104.

In an example implementation, to further enhance performance of the transmitter 100, particularly with respect to the pre-distortion performed by it and/or the dynamical calibration of such pre-distortion, equalization may be used. For example, linear distortion of the PGPA circuit 110 may be equalized before use in controlling pre-distortion (e.g., before use in estimating pre-distortion nonlinear parameter(s)). With reference to the implementation shown in FIG. 1, the output signal of the PGPA circuit 110 (e.g., signal 111, tapped as feedback input), may be equalized (e.g., in the feedback conditioning circuit 112) before being considering PGPA linear distortion during the feedback conditioning stage.

In some instances, there may be variations in performance and/or capabilities between component(s) in the transmit path and component(s) used in the feedback/control branch, which may be accounted for when configuring the feedback/control operations. For example, memory in the PGPA circuit 110 may be substantially larger than the sampling time interval in which pre-distortion operates, which may be accounted for during feedback/control operations. In an example implementation, the pre-distortion may be configured to either operate at slower rate, or some of the memory terms can be skipped which results in lower complexity.

In various example implementations, the feedback conditioning and/or pre-distortion control may be implemented as fully analog, fully digital, or mixed analog-digital. For example, each of the pre-distortion control circuit 114 and the feedback conditioning circuit 112 may be implemented to operate on digital and/or analog signals—that is they would operate, when applying the functions performed thereby, on analog or digital signals. Accordingly, these components may be implemented to incorporate (as needed) analog-to-digital converter (ADC) circuit(s) and/or digital-to-analog converter (DAC) circuit(s), to ensure that necessary conversions, to the input signal(s), the output signal(s), and/or intermediate signal(s) (if any), can be performed. For example, with reference to the implementation shown in FIG. 1, where the feedback conditioning circuit 112 is implemented to operate on digital signals, the feedback conditioning circuit 112 may comprise DAC circuit(s) to apply analog-to-digital conversions to signals 109 and 111. In another example implementation, where the feedback conditioning circuit 112 is implemented to operate on analog signals whereas the pre-distortion control circuit 114 is implemented to operate on digital signals, the feedback conditioning circuit 112 may comprise ADC circuit(s) to apply analog-to-digital conversions before outputting signal 113 (thus, this signal would be a digital signal); or alternatively the pre-distortion control circuit 114 may comprise ADC circuit(s) to apply analog-to-digital conversions to signal 113 (which would be, in this case, analog signal).

In an example implementation, the pre-distortion control circuit 114 and/or the feedback conditioning circuit 112 may be implemented such that to operate variably and/or adaptively on analog and/or digital signals. Thus, the pre-distortion control circuit 114 and/or the feedback conditioning circuit 112 may be configured dynamically to operate on analog and/or digital signals. Further, to ensure that necessary conversions are performed (e.g., based on the type of signal being input and/or being expected at the output, and/or based on the type of operation the circuit(s) are configured to perform), the pre-distortion control circuit 114 and/or the feedback conditioning circuit 112 may incorporate analog-to-digital converter (ADC) circuit(s) and digital-to-analog converter (DAC) circuit(s), which may be configured for operation as needed.

Figure 2A:
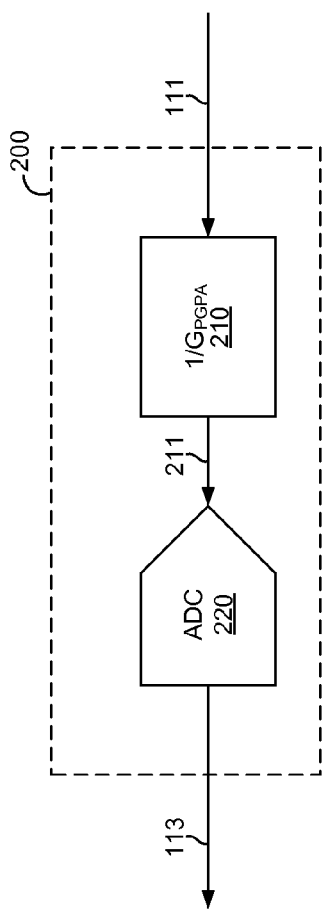
FIG. 2A depicts an example implementation of a feedback conditioning circuit, in accordance with the present disclosure.

FIG. 2A depicts an example implementation of a feedback conditioning circuit, in accordance with the present disclosure. Shown in FIG. 2A is a feedback conditioning circuit 200.

The feedback conditioning circuit 200 may be operable to control pre-distortion control circuitry in a system. In this regard, the feedback conditioning circuit 200 may correspond to (and thus represents an example implementation of) the feedback conditioning circuit 112 of FIG. 1, which is used to control pre-distortion control circuit 114 of the transmitter 100, substantially as described with reference to FIG. 1 for example. As shown in FIG. 2A, the feedback conditioning circuit 200 may comprise an analog-to-digital convertor (ADC) circuit 220 and a gain circuit 210.

The gain circuit 210 applies a gain of $1/G_{PGPA\ circuit}$ (where $G_{PGPA\ circuit}$ is the gain of the PGPA circuit 110 of the transmitter 100 described with reference to FIG. 1) to the signal 111, to generate corresponding output signal 211, which is then digitized by ADC circuit 220 for conveyance (e.g., via the control signal 113) to the pre-distortion control circuitry (e.g., the pre-distortion control circuit 114). The ADC circuit 220 may be implemented to further enhance performance. For example, the ADC circuit 220 may be a low-resolution ADC, to save power and/or space (chip area). To achieve the gain $1/G_{PGPA\ circuit}$, the gain circuit 210 may use automatic gain control (AGC) techniques using a feedback loop, for example.

Figure 2B:
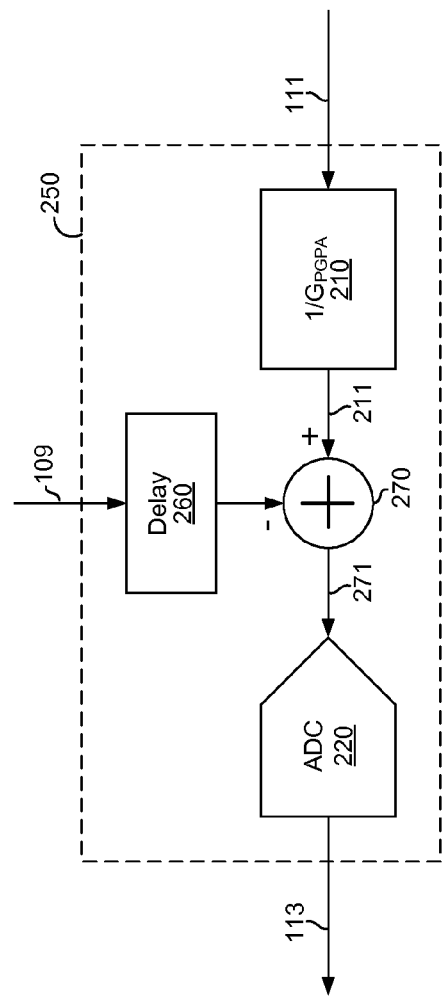
FIG. 2B depicts another example implementation of a feedback conditioning circuit, in accordance with the present disclosure.

FIG. 2B depicts another example implementation of a feedback conditioning circuit, in accordance with the present disclosure. Shown in FIG. 2B is a feedback conditioning circuit 250.

The feedback conditioning circuit 250 may be substantially similar to the feedback conditioning circuit 200 of FIG. 2A, that is, it may also be operable to control pre-distortion control circuitry in a system. In this regard, the feedback conditioning circuit 250 may correspond to (and thus represent an alternative example implementation of) the feedback conditioning circuit 112 of FIG. 1, which is used to control pre-distortion control circuit 114 of the transmitter 100, substantially as described with reference to FIG. 1 for example. As shown in FIG. 2B, the feedback conditioning circuit 200 may comprise the ADC circuit 220 and the gain circuit 210, as described with respect to FIG. 2A. Further, feedback conditioning circuit 250 additionally comprises a delay block 260 and a combiner 270.

The feedback conditioning circuit 250 may operate in a substantially similar manner to that of the feedback conditioning circuit 200, as described with reference to FIG. 2A—that is by using the gain circuit 210 and the ADC circuit 220 to apply and digitize gain $1/G_{PGPA\ circuit}$. The additional components of feedback conditioning circuit 250 may further allow for incorporation of a second reference signal, particularly signal 109 (output of the DAC circuit 108 of FIG. 1). In this regard, the signal 109 may be delayed by delay block 260, and then subtracted from signal 211, to generate modified output signal 271 which is then digitized by ADC circuit 220 for conveyance (e.g., via the control signal 113) to the pre-distortion control circuitry (e.g., pre-distortion control circuit 114).

Figure 3:
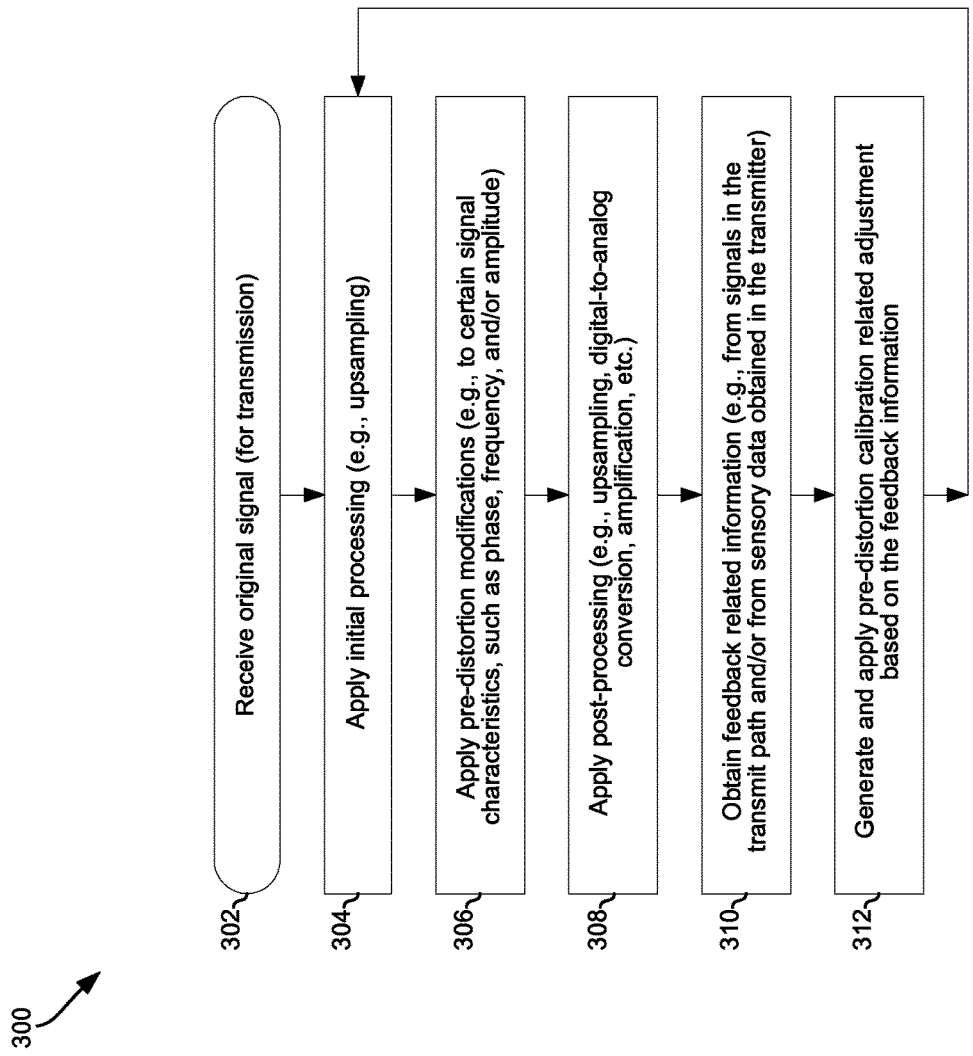
FIG. 3 depicts a flowchart of an example process for dynamic calibration of pre-distortion during signal transmission, in accordance with the present disclosure.

FIG. 3 depicts a flowchart of an example process for dynamic calibration of pre-distortion during signal transmission, in accordance with the present disclosure. Shown in FIG. 3 is flow chart 300, comprising a plurality of example steps (represented as blocks 302-312), which may be performed in a suitable system (e.g., transmitter 100) to facilitate dynamic calibration of pre-distortion during signal transmission.

In step 302, an original input signal may be received, being intended for transmission. The input signal may be a digital signal.

In step 304, initial processing may be applied to the input signal. The initial processing may comprise, for example, upsampling.

In step 306, pre-distortion modification may be applied (e.g., to certain signal characteristics, such as phase, frequency, and/or amplitude) of the signal resulting from the initial processing. In this regard, the pre-distortion modification may be configured (or adjusted) based on prior feedback (and/or current information—e.g., current temperature reading). Nonetheless, in some instances, the pre-distortion modification may be initialized to allow application of such modification where no feedback is yet available.

In step 308, post-processing (e.g., upsampling, digital-to-analog conversion, amplification, etc.) may be applied to the signal resulting from application of the pre-distortion modification.

In step 310, feedback related information (e.g., information relating to or derive from intermediate signals in the transmit path and/or from sensory data obtained in the transmitter) may be obtained.

In step 312, pre-distortion calibration related adjustments may be generated based on the feedback information, and then applied. In this regard, the feedback related information may be processed to determine the adjustments. The application of the pre-distortion calibration adjustments may be done in feedback manner; and thus it would be applied immediately to current operations. Thus, the pre-distortion modification may be adjusted during processing of the same input signal.

Figure 4:
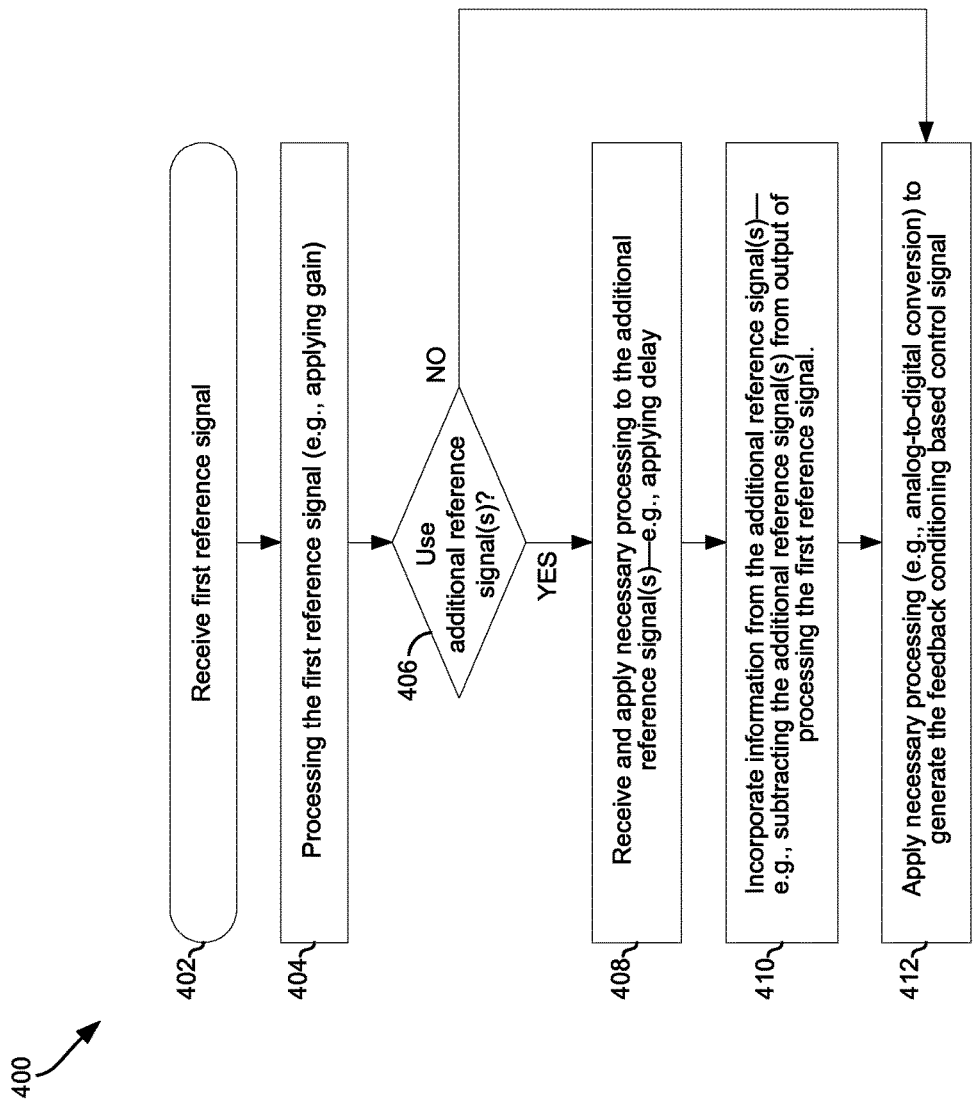
FIG. 4 depicts a flowchart of an example process for controlling pre-distortion adjustments, based on feedback conditioning, in a system during dynamic calibration of pre-distortion applied in signal transmission, in accordance with the present disclosure.

FIG. 4 depicts a flowchart of an example process for controlling pre-distortion adjustments, based on feedback conditioning, in a system during dynamic calibration of pre-distortion applied in signal transmission, in accordance with the present disclosure. Shown in FIG. 4 is flow chart 400, comprising a plurality of example steps (represented as blocks 402-412), which may be performed in a suitable system (e.g., feedback conditioning circuit 200 or feedback conditioning circuit 250) to facilitate dynamic calibration of pre-distortion during signal transmission.

In step 402, a first reference signal (e.g., signal 111, corresponding to output of PGPA circuit 110) may be received.

In step 404, the first reference signal may be processed. For example, gain (e.g., gain of $1/G_{PGPA\ circuit}$) may be applied to the first reference signal.

In step 406, it may be determined whether additional reference signal(s) are to be used. In instances where no additional reference signal(s) are used, the process may proceed directly to step 412; otherwise (i.e., one or more additional reference signal(s) are used, the process may proceed to step 408.

In step 408, additional reference signal(s) (e.g., signal 109, corresponding to output of DAC circuit 108) may be received and processed. For example, a delay (e.g., via delay block 260 in circuit 250) may be applied to a second reference signal (signal 109).

In step 410, information from the additional reference signal(s) may be incorporated. For example, the second additional reference signal maybe subtracted (e.g., via combiner 270) from the output of processing the first reference signal.

In step 412, post-processing (e.g., analog-to-digital conversion, via ADC circuit 220) may be applied to generate a feedback conditioning based control signal.

Figure 5:
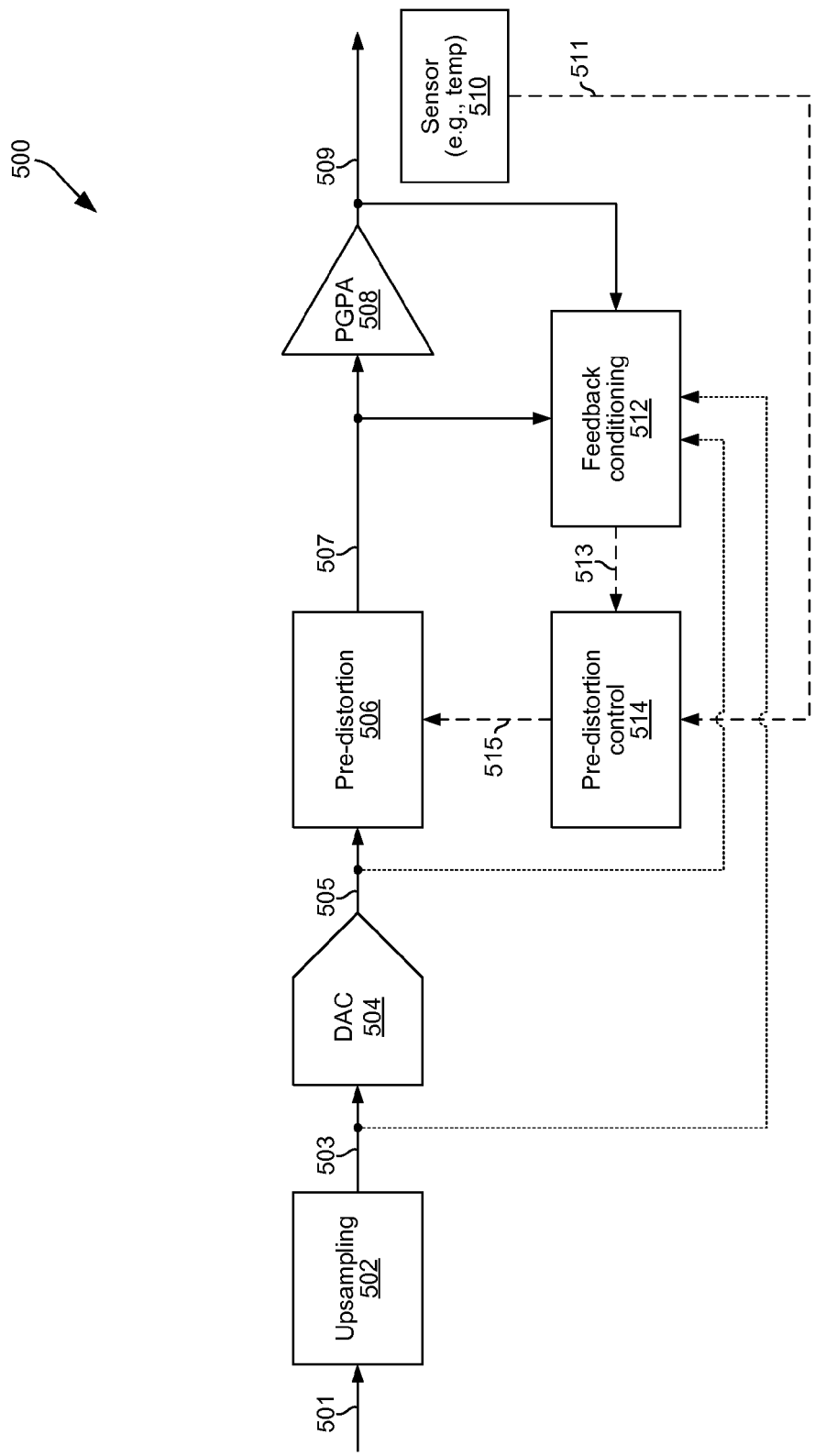
FIG. 5 depicts another example transmitter that may be operable to perform dynamic calibration of pre-distortion, where the pre-distortion is implemented in the analog side, in accordance with the present disclosure.

FIG. 5 depicts another example transmitter that may be operable to perform dynamic calibration of pre-distortion, where the pre-distortion is implemented in the analog side, in accordance with the present disclosure. Shown in FIG. 5 is an example transmitter 500.

The transmitter 500 may be substantially similar to the transmitter 100 of FIG. 1. In this regard, the transmitter 500 may comprise suitable circuitry for processing and transmitting signals, which may be configured for communication in accordance with one or more wireless or wire-based interfaces (and/or protocols), and may be particularly configured to perform dynamic calibration of pre-distortion during transmission related operations. For example, as shown in the example implementation depicted in FIG. 5, the transmitter 500 may comprise an upsampling circuit 502, a digital-to-analog convertor (DAC) circuit 504, a pre-distortion circuit 506, a programmable gain power amplifier (PGPA) circuit 508, a feedback conditioning circuit 512, and a pre-distortion control circuit 514. Also shown is a sensor 510.

Each of the upsampling circuit 502, the DAC circuit 504, the pre-distortion circuit 506, the PGPA circuit 508, the sensor 510, the feedback conditioning circuit 512, and the pre-distortion control circuit 514 may be substantially similar to similarly-named components of the transmitter 100 of FIG. 1 (i.e., the upsampling circuit 102/106, the DAC circuit 108, the pre-distortion circuit 104, the PGPA circuit 110, the sensor 120, the feedback conditioning circuit 112, and the pre-distortion control circuit 114, respectively), and may be operate in substantially similar manner.

The transmitter 500 may operate substantially in similar manner as the transmitter 100, as described with respect to FIG. 1, for example. In an example operation, starting with an input signal 501 (e.g., a baseband data-carrying signal), the upsampling circuits 502 may upsample the signal 501 to generate a corresponding signal (e.g., signal 503). The signal 503 may be input into the DAC circuit 504, for digital-to-analog conversion thereby, resulting in corresponding analog signal 505.

The signal 505 may then be input into the pre-distortion circuit 506, which may apply (in the analog domain) modifications (i.e., distortion) to characteristics (e.g., phase, frequency, and/or amplitude) of the signal 505, such as based on the control signal 515, to generate a pre-distorted analog signal (e.g., signal 507). The pre-distorted signal 507 may be input into the PGPA circuit 508, which may amplify the analog signal 507, to generate the corresponding amplified signal 509, which may have sufficient power for propagation over a physical medium to a receiver. The signal 509 (or modified copy thereof) may then be transmitted, via a suitable front-end (not shown). The PGPA circuit 508 may introduce phase, frequency, and/or amplitude distortion.

The transmitter 500 may be operable to perform dynamic calibration of pre-distortion, such as based on feedback, substantially in similar manner as the transmitter 100, as described with respect to FIG. 1, for example. Operation of the transmitter 500 may be modified, however, to account for the fact that the pre-distortion is done on the analog-side (that is after the input signal had been subject to digital-to-analog conversion, via the DAC 504). In this regard, a goal of the modifications performed by pre-distortion circuit 506 (e.g., on the signal 505) may be to cancel and/or compensate for distortion introduced by the other elements further down the transmit path—e.g., the PGPA circuit 508. Such distortion may dynamically change. For example, distortion introduced by the PGPA circuit 508 may change as certain conditions (e.g., temperature; power supply voltage; amplitude, phase; amplitude, phase, and/or frequency of signal 507; etc.) may change. Accordingly, in various implementations, pre-distortion may be dynamically calibrated, such as by dynamically adjusting parameters of the pre-distortion circuit 506 to account for such changed conditions/parameters in, or near, real-time.

For example, in the particular example implementation shown in FIG. 5, the pre-distortion control circuit 514 may be used to control or adjust the pre-distortion being performed via the pre-distortion circuit 506, substantially as described with respect to the pre-distortion control circuit 114 and the pre-distortion circuit 104 of FIG. 1. In this regard, the pre-distortion control circuit 514 may generate the control signal 515, which may be input to the pre-distortion circuit 506 to enable controlling and/or adjusting operations thereof. Further, as described with respect to FIG. 1, the pre-distortion control circuit 514 may be controlled based on input (e.g., control signal 513) from the feedback conditioning circuit 512, thus facilitating the adaptive, feedback based, control of pre-distortion. As with the feedback conditioning circuit 112 of FIG. 1, the feedback conditioning circuit 512 may also be operable to condition one or more signals in the transmitter, such as one or more of signals 509, 507, 505, and 503; to make the signal(s) suitable for use by the pre-distortion circuit 514.

The result of the conditioning performed by the feedback conditioning circuit 512 may be conveyed via the control signal 513, and ultimately the effect of the conditioned signals may be conveyed to (e.g., used to control) pre-distortion circuit 506 via the control signal 515. As with the pre-distortion control circuit 114 of FIG. 1, the pre-distortion control circuit 514 may also be controlled based on sensory-based input, such as from the sensor 510. For example, the sensor 510 may obtain temperature related information relating to the transmitter 500 (and/or it various components thereof), and may output based thereon the signal 511, which may indicate temperature of the transmitter 500 generally, and/or of one or more of the components 502, 504, 506, 508 specifically. Other factors that may be considered in controlling the pre-distortion performed in the transmitter 500 (e.g., being feed into and used by the pre-distortion control circuit 514) may comprise parameters relating or pertinent to function of other components (e.g., PGPA gain).

As with the transmitter 100 of FIG. 1, the feedback conditioning and/or pre-distortion control may be implemented as fully analog, fully digital, or mixed analog-digital. Thus, similar to the feedback conditioning circuit 112 and the pre-distortion control circuit 114 of FIG. 1, each of the pre-distortion control circuit 514 and the feedback conditioning circuit 512 may be implemented to (including, in some example implementations, being dynamically configurable to variably do so) operate on digital and/or analog signals, as described in more detail with respect to FIG. 1.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, various embodiments in accordance with the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

Various embodiments in accordance with the present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
a transmitter comprising one or more circuits, said one or more circuits being operable to:
apply, during processing of an input signal for transmission, pre-distortion modification;
generate a plurality of feedback signals, wherein each of said plurality of feedback signals corresponds to a particular processing stage performed in the transmitter after application of said pre-distortion modification, said generating comprising:
conditioning at least one of said plurality of feedback signals, wherein said conditioning is configured based on a type and/or a source of said at least one of said plurality of feedback signals;
applying gain to a first one of said plurality of feedback signals;
applying delay to a second one of said plurality of feedback signals; and
subtracting, after applying said delay, said second one of said plurality of feedback signals from said first one of said plurality of feedback signals after applying said gain;
generate control data based on said plurality of feedback signals;
determine, based on said control data, one or more adjustments to said pre-distortion modification; and
apply said one or more adjustments to said pre-distortion modification;
wherein said one or more adjustments are determined and/or applied periodically or based on one or more of: characteristics of one or more references signals used during transmission of signals, one or more environmental conditions, and parameters relating to function of at least one circuits used during transmission of signals.

2. The system of claim 1, wherein said pre-distortion modification comprises modifying one or more characteristics of said input signal.

3. The system of claim 2, wherein said one or more characteristics comprise at least one of: phase, frequency, and amplitude.

4. The system of claim 1, wherein said plurality of feedback signals comprise one or more intermediate signals generated within the transmitter during said processing performed after application of said pre-distortion modification in the transmitter.

5. The system of claim 4, wherein said one or more circuits are operable to process said one or more intermediate signals to obtain said data relating to or derived from said one or more intermediate signals.

6. The system of claim 1, wherein said one or more circuits are operable to determine said one or more adjustments based on sensory data relating to the transmitter and/or one or more components of the transmitter.

7. The system of claim 6, wherein said sensory data comprise data relating to temperature and/or other environmental conditions.

8. A method comprising:
applying, during processing of an input signal for transmission, pre-distortion modification;
generating a plurality of feedback signals, wherein each of said plurality of feedback signals corresponds to a particular processing stage performed in the transmitter after application of said pre-distortion modification, said generating comprising:
conditioning at least one of said plurality of feedback signals, wherein said conditioning is configured based on a type and/or a source of said at least one of said feedback signals;
applying gain to a first one of said plurality of feedback signals;
applying delay to a second one of said plurality of feedback signals; and
subtracting, after applying said delay, said second one of said plurality of feedback signals from said first one of said plurality of feedback signals after applying said gain;
generating control data based on said plurality of feedback signals; and
applying said one or more adjustments to said pre-distortion modification;
wherein said one or more adjustments are determined and/or applied periodically or based on one or more of: characteristics of one or more references signals used during transmission of signals, one or more environmental conditions, and parameters relating to function of at least one circuits used during transmission of signals.

9. The method of claim 8, wherein said pre-distortion modification comprises modifying one or more characteristics of said input signal.

10. The method of claim 9, wherein said one or more characteristics comprise at least one of: phase, frequency, and amplitude.

11. The method of claim 8, wherein said plurality of feedback signals comprise one or more intermediate signals generated within the transmitter during said processing performed after application of said pre-distortion modification in the transmitter.

12. The method of claim 11, comprising processing said one or more intermediate signals to obtain said data relating to or derived from said one or more intermediate signals.

13. The method of claim 8, comprising determining said one or more adjustments based on sensory data relating to the transmitter and/or one or more components of the transmitter.

14. The method of claim 13, wherein said sensory data comprise data relating to temperature and/or other environmental conditions.

15. A system comprising:
a transmitter comprising one or more circuits for use in controlling pre-distortion modification, said one or more circuits being operable to:
process a plurality of intermediate signals generated within the transmitter during processing of an input signal, wherein:
each of said plurality of intermediate signals corresponds to a particular processing stage performed in the transmitter after application of said pre-distortion modification; and
said processing of said plurality of intermediate signals comprises:
conditioning of at least one of said plurality of intermediate signals based on a type and/or source of said at least one of said plurality of intermediate signals;

applying a gain to a first intermediate signal, wherein said gain is derived from a gain used and applied during said processing of said input signal that is performed after application of said pre-distortion modification;

applying a delay to a second intermediate signal; and subtracting, after said delay, said second intermediate signal from output of said application of gain to said first intermediate signal; and generate based on said processing, at least one control signal, wherein:

said at least one control signal is used in adjusting said pre-distortion modification in the transmitter; and said control signal is generated and/or applied, to effect said adjusting of said pre-distortion modification, periodically or based on one or more of: characteristics of one or more references signals used during transmission of signals, one or more environmental conditions, and parameters relating to function of at least one circuits used during transmission of signals.

16. The system of claim 15, wherein said processing of said one or more intermediate signals comprises applying analog-to-digital conversion, to generate said at least one control signal as a digital signal.

* * * * *